United States Patent
Ohnishi et al.

(10) Patent No.: US 10,172,268 B2
(45) Date of Patent: Jan. 1, 2019

(54) ELECTRONIC COMPONENT MOUNTING DEVICE

(71) Applicant: YAMAHA HATSUDOKI KABUSHIKI KAISHA, Iwata-shi, Shizuoka-ken (JP)

(72) Inventors: Seiji Ohnishi, Kumagaya (JP); Koichi Izuhara, Iwata (JP); Hiroyuki Watanabe, Kumagaya (JP); Takashi Yoshii, Kumagaya (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 156 days.

(21) Appl. No.: 15/272,910

(22) Filed: Sep. 22, 2016

(65) Prior Publication Data

US 2017/0013750 A1 Jan. 12, 2017

Related U.S. Application Data

(63) Continuation of application No. PCT/JP2015/058489, filed on Mar. 20, 2015.

(30) Foreign Application Priority Data

Mar. 31, 2014 (JP) ................. 2014-070840

(51) Int. Cl.
*B23P 19/00* (2006.01)
*H05K 13/04* (2006.01)

(52) U.S. Cl.
CPC ......... *H05K 13/0404* (2013.01); *H05K 13/04* (2013.01); *H05K 13/0406* (2018.08)

(58) Field of Classification Search
CPC ....... B23K 1/203; H01L 24/742; H01L 24/75; H01L 24/81; H05K 3/0097; H05K 3/303;
(Continued)

(56) References Cited

U.S. PATENT DOCUMENTS

2009/0056114 A1  3/2009 Kanai et al.
2016/0309630 A1* 10/2016 Amano ................. H05K 13/08

FOREIGN PATENT DOCUMENTS

CN  101411256 A   4/2009
EP  0 891 129 A2  1/1999
(Continued)

OTHER PUBLICATIONS

An Office Action; "Decision to Decline the Amendment" issued by the Japanese Patent Office dated Feb. 13, 2018, which corresponds to Japanese Patent Application No. 2014-070840 and is related to U.S. Appl. No. 15/272,910; with English translation.
An Office Action; "Decision of Refusal" issued by the Japanese Patent Office dated Feb. 13, 2018, which aorresponds to Japanese Patent Application No. 2014-070840 and is related to U.S. Appl. No. 15/272,910; with English translation.
(Continued)

*Primary Examiner* — Paul D Kim
(74) *Attorney, Agent, or Firm* — Studebaker & Brackett PC

(57) ABSTRACT

A component mounting device includes a mounting head that is movable in a horizontal direction and mounts a held component on a substrate and a control portion that controls the operation of the mounting head. The control portion is configured to perform control of a speed of mounting, by the mounting head, of a component to be located closely adjacent to another component and to be mounted on the substrate such that an interval to an adjacent component is equal to or less than a predetermined threshold, on the substrate. A speed of mounting of the component is less than a speed of mounting in a normal state in which the mounting head mounts a component, which is not the component to be located closely adjacent to another component, on the substrate.

8 Claims, 4 Drawing Sheets

(58) Field of Classification Search
CPC .... H05K 3/341; H05K 3/3468; H05K 3/3473; H05K 3/3494; H05K 13/08; H05K 13/0465
See application file for complete search history.

(56) References Cited

FOREIGN PATENT DOCUMENTS

| | | |
|---|---|---|
| EP | 1 081 998 A2 | 3/2001 |
| EP | 1 189 497 A2 | 3/2002 |
| JP | H01-298800 A | 12/1989 |
| JP | 2001-223499 A | 8/2001 |
| JP | 2002-252495 A | 9/2002 |
| JP | 2003-069290 A | 3/2003 |
| JP | 2007-158115 A | 6/2007 |
| JP | 2011-018817 A | 1/2011 |

OTHER PUBLICATIONS

The extended European search report issued by the European Patent Office dated Apr. 28, 2017, which corresponds to European Patent Application No. 15773376.7-1803 and is related to U.S. Appl. No. 15/272,910.
International Search Report issued in PCT/JP2015/058489; dated Jun. 23, 2015.
Written Opinion issued in PCT/JP2015/058489; dated Jun. 23, 2015.
An Office Action; "Notice of Reasons for Rejection" issued by the Japanese Patent Office dated Jul. 11, 2017, which corresponds to Japanese Patent Application No. 2014-070840 and is related to U.S. Appl. No. 15/272,910; with English translation.
An Office Action issued by the Chinese Patent Office dated Apr. 3, 2018, which corresponds to Chinese Patent Application No. 201580007232.2 and is related to U.S. Appl. No. 15/272,910.

\* cited by examiner

| STEP | COMPONENT ID | X | Y | θ | FEEDER NO. | HEAD NUMBER | CYCLE | CLOSE ADJACENCY FLAG |
|---|---|---|---|---|---|---|---|---|
| 21 | B3 | X3 | Y3 | θ3 | F103 | 1 | 3a | |
| 22 | B4 | X4 | Y4 | θ4 | F104 | | | |
| 23 | B5 | X5 | Y5 | θ5 | F105 | | | |
| 24 | B6 | X6 | Y6 | θ6 | F106 | | | |
| 25 | B7 | X7 | Y7 | θ7 | F107 | | | |
| 26 | B8 | X8 | Y8 | θ8 | F108 | | | |
| 27 | B9 | X9 | Y9 | θ9 | F209 | 2 | 3b | |
| 28 | B10 | X10 | Y10 | θ10 | F210 | | | |
| 29 | B11 | X11 | Y11 | θ11 | F211 | | | 1 |
| 30 | B12 | X12 | Y12 | θ12 | F212 | | | |
| 31 | B15 | X15 | Y15 | θ15 | F109 | 1 | 4a | |
| 32 | B16 | X16 | Y16 | θ16 | F110 | | | |
| 33 | B17 | X17 | Y17 | θ17 | F101 | | | |
| 34 | B18 | X18 | Y18 | θ18 | F102 | | | |
| 35 | B19 | X19 | Y19 | θ19 | F111 | | | |
| 36 | B20 | X20 | Y20 | θ9 | F207 | 2 | 4b | |
| 37 | B21 | X21 | Y21 | θ10 | F208 | | | |
| 38 | B9 | X22 | Y22 | θ9 | F209 | | | 1 |
| 39 | B10 | X23 | Y23 | θ10 | F210 | | | 1 |
| 40 | B11 | X24 | Y24 | θ11 | F211 | | | 1 |
| 41 | B12 | X25 | Y25 | θ12 | F212 | | | |

| STEP | COMPONENT ID | X | Y | θ |
|---|---|---|---|---|
| 1 | B1 | X1 | Y1 | θ1 |
| 2 | B2 | X2 | Y2 | θ2 |
| 3 | B3 | X3 | Y3 | θ3 |
| 4 | B4 | X4 | Y4 | θ4 |
| 5 | B5 | X5 | Y5 | θ5 |
| 6 | B6 | X6 | Y6 | θ6 |

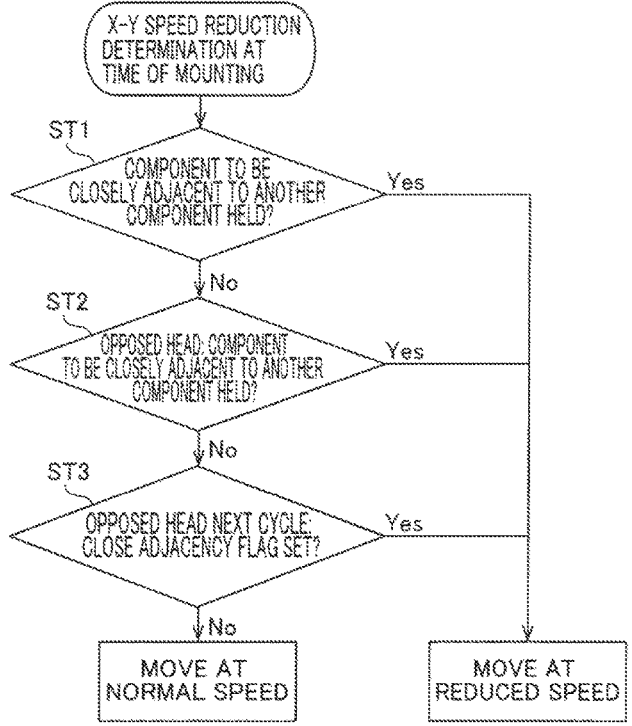
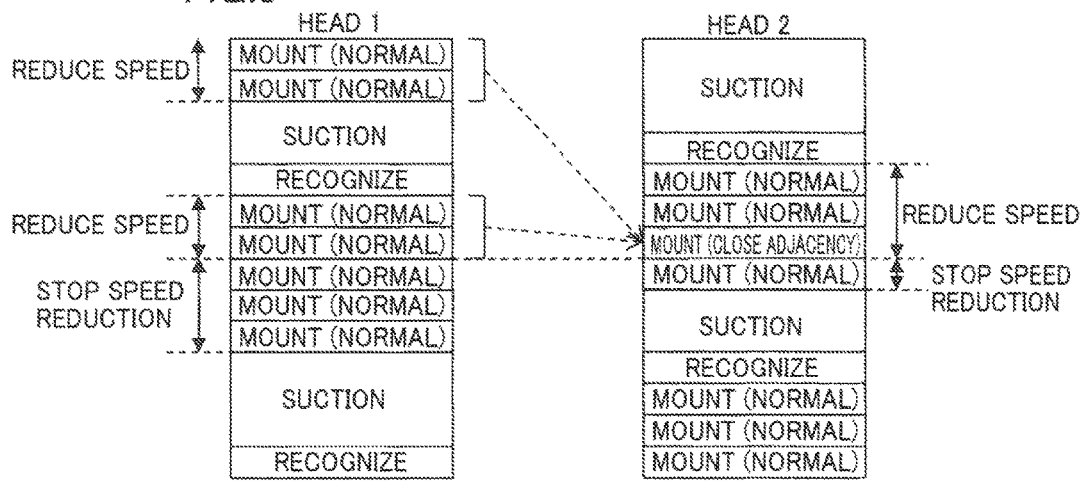
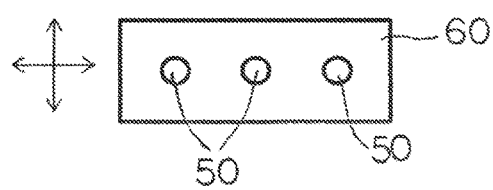

ELECTRONIC COMPONENT MOUNTING DEVICE

CROSS REFERENCE TO RELATED APPLICATIONS

This application claims benefit of priority to Japanese Patent Application 2014-070840 filed Mar. 31, 2014, and to International Patent Application No. PCT/JP2015/058489 filed Mar. 20, 2015, the entire content of which is incorporated herein by reference.

TECHNICAL FIELD

The present disclosure relates to an electronic component mounting device that mounts an electronic component on a substrate.

BACKGROUND

In general, an electronic component mounting device that mounts electronic components on a substrate is known. In this electronic component mounting device, if the interval of an electronic component to an adjacent electronic component is narrow when the electronic component is mounted on a printed board, a suction nozzle is likely to interfere with the adjacent component, and hence the suction nozzle is shaped such that interference is unlikely to occur. Such an electronic component mounting device is disclosed in Japanese Patent Laying-Open No. 2011-18817, for example.

SUMMARY

Problem to be Solved by the Disclosure

However, when an interval to an adjacent electronic component is narrower and a speed of mounting the electronic component is increased so that the number of substrates to be produced per unit time is increased, there is a limit in restraining the interference by changing the shape of the nozzle as in the conventional art. Thus, an object of the present disclosure is to mount the electronic component with a high degree of accuracy on the substrate having a region in which the mounting interval of the electronic component is narrow while a reduction in the productivity is minimized.

Means for Solving the Problem

A component mounting device according to a first aspect of the present disclosure includes a mounting head that is movable in a horizontal direction and mounts a held component on a substrate and a control portion that controls the operation of the mounting head. The control portion is configured to perform control of making a speed of mounting, by the mounting head, of a component to be located closely adjacent to another component and to be mounted on the substrate such that an interval to an adjacent component is equal to or less than a predetermined threshold, on the substrate, less than a speed of mounting in a normal state in which the mounting head mounts a component, which is not the component to be located closely adjacent to another component, on the substrate.

In the component mounting device according to the first aspect of the present disclosure, as hereinabove described, the control portion is configured to perform control of making the speed of mounting, by the mounting head, of the component to be located closely adjacent to another component and to be mounted on the substrate is such that the interval to the adjacent component is equal to or less than a predetermined threshold, on the substrate, less than the speed of mounting in the normal state in which the mounting head mounts the component, which is not the component to be located closely adjacent to another component, on the substrate. Thus, the vibration of the mounting head can be restrained, and hence the interference of the mounting head or the component to be located closely adjacent to another component held by the mounting head with the adjacent component already mounted on the substrate due to the vibration of the mounting head can be restrained when the component to be located closely adjacent to another component is mounted on the substrate. Consequently, the component can be mounted with a high degree of accuracy on the substrate having a region in which the mounting interval of the component is narrow while a reduction in the productivity is minimized.

In the aforementioned component mounting device according to the first aspect, the control portion is preferably configured to perform control of making the horizontal movement speed of the mounting head in the case where the mounting head mounts the component to be located closely adjacent to another component on the substrate less than the horizontal movement speed in the normal state in which the mounting head mounts the component, which is not the component to be located closely adjacent to another component, on the substrate. Thus, even if there are a plurality of mounting heads, the interference of one of the mounting heads or the component to be located closely adjacent to another component held by one of the mounting heads with the adjacent component already mounted on the substrate due to a vibration caused by the horizontal movement of the other of the mounting heads can be restrained when one of the mounting heads mounts the component to be located closely adjacent to another component on the substrate.

In this case, the mounting head preferably includes a first mounting head and a second mounting head movable independently of the first mounting head. The control portion is preferably configured to perform control of making the horizontal movement speeds of both the first mounting head and the second mounting head less than the movement speeds in a normal state in which both the first mounting head and the second mounting head hold only the component, which is not the component to be located closely adjacent to another component, when at least one of the first mounting head and the second mounting head holds the component to be located closely adjacent to another component. Thus, the interference of one of the mounting heads or the component to be located closely adjacent to another component held by one of the mounting heads with the adjacent component already mounted on the substrate due to the vibration of the other of the mounting heads can be restrained when one of the mounting heads mounts the component to be located closely adjacent to another component on the substrate. Consequently, the component can be efficiently mounted by the plurality of mounting heads (the first mounting head and the second mounting head) while the component is mounted with a high degree of accuracy on the substrate having the region in which the mounting interval of the component is narrow.

In the aforementioned component mounting device according to the first aspect, the mounting head preferably includes a suction nozzle movable in a vertical direction, and the control portion is preferably configured to perform control of making the vertical movement speed of the suction nozzle less than the movement speed in the normal state when the component to be located closely adjacent to another component is mounted on the substrate. Thus, the interference of the suction nozzle or the component to be located closely adjacent to another component held by the suction nozzle with the adjacent component already mounted on the substrate due to the vibration of the mounting head can be restrained when the suction nozzle mounts the component to be located closely adjacent to another component on the substrate.

In this case, the mounting head is preferably configured to be rotatable about an axis extending in the vertical direction, and the control portion is preferably configured to perform control of making a rotation speed about the axis less than the rotation speed in the normal state, in addition to the control of making the vertical movement speed of the suction nozzle less than the movement speed in the normal state, when the component to be located closely adjacent to another component is mounted on the substrate. Thus, the interference of the suction nozzle or the component to be located closely adjacent to another component held by the suction nozzle with the adjacent component already mounted on the substrate due to the vibration of the mounting head can be restrained even in the case where the suction head rotates about the axis when the suction nozzle mounts the component to be located closely adjacent to another component on the substrate.

In the aforementioned structure in which the mounting head includes the suction nozzle movable in the vertical direction, the mounting head preferably includes a plurality of suction nozzles, and the control portion is preferably configured to perform control of making the vertical movement speed of the suction nozzle that suctions the component to be located closely adjacent to another component less than the movement speed in the normal state when the component to be located closely adjacent to another component is mounted on the substrate when at least one of the plurality of suction nozzles suctions the component to be located closely adjacent to another component. Thus, the component, which is not the component to be located closely adjacent to another component, can be promptly mounted without changing the vertical movement speed of the suction nozzle suctioning the component, which is not the component to be located closely adjacent to another component (at the movement speed in the normal state) when the component, which is not the component to be located closely adjacent to another component, is mounted on the substrate while the interference of the suction nozzle or the component to be located closely adjacent to another component held by the suction nozzle with the adjacent component already mounted on the substrate is restrained when the component to be located closely adjacent to another component is mounted on the substrate. Consequently, the component to be located closely adjacent to another component can be mounted with a high degree of accuracy while a reduction in the productivity is properly restrained.

In this case, the control portion is preferably configured to perform control of releasing a state in which a speed of mounting operation performed by the suction nozzles is reduced, on the basis of completion of mounting of the component to be located closely adjacent to another component, in the state in which the plurality of suction nozzles suction the component to be located closely adjacent to another component and the component, which is not the component to be located closely adjacent to another component, in a mixed manner. Thus, a reduction in the productivity can be further restrained, unlike the case where the state in which the speed of the mounting operation performed by the suction nozzles is reduced is uniformly maintained in the state in which the plurality of suction nozzles suction the component to be located closely adjacent to another component and the component, which is not the component to be located closely adjacent to another component, in a mixed manner.

In the aforementioned component mounting device according to the first aspect, the control portion is preferably configured to perform control of making the speed of mounting, by the mounting head, the component to be located closely adjacent to another component on the substrate less than the speed of mounting in the normal state in which the mounting head mounts the component, which is not the component to be located closely adjacent to another component, on the substrate, on the basis of information about the mounting position and the mounting angle of the component. Thus, it can be easily determined whether or not a component to be mounted on the substrate is the component to be located closely adjacent to another component on the basis of the information about the mounting position and the mounting angle of the component. Consequently, complication of control processing for making the speed of mounting the component to be located closely adjacent to another component on the substrate less than the speed of mounting in the normal state in which the component, which is not the component to be located closely adjacent to another component, is mounted on the substrate can be restrained.

A component mounting method according to a second aspect of the present disclosure includes holding, by a mounting head, a component to be mounted on a substrate and making a speed of mounting, by the mounting head, a component to be located closely adjacent to another component, of which an interval to an adjacent component is equal to or less than a predetermined threshold, on the substrate, less than a speed of mounting, by the mounting head, a component, of which an interval to an adjacent component is not equal to or less than the predetermined threshold.

In the component mounting method according to the second aspect of the present disclosure, the vibration of the mounting head can be restrained by the above steps, and hence the interference of the mounting head or the component to be located closely adjacent to another component held by the mounting head with the adjacent component already mounted on the substrate due to the vibration of the mounting head can be restrained when the component to be located closely adjacent to another component is mounted on the substrate. Consequently, the component can be mounted with a high degree of accuracy on the substrate having a region in which the mounting interval of the component is narrow while a reduction in the productivity is minimized.

Effect of the Disclosure

According to the present disclosure, the electronic component can be mounted with a high degree of accuracy on the substrate having the region in which the mounting interval of the electronic component is narrow while a reduction in the productivity is minimized.

BRIEF DESCRIPTION OF THE DRAWINGS

FIG. 8 is a diagram showing a flowchart in which a speed reduction determination for mounting heads is executed.

FIG. 9 is a schematic view showing the states of the movement speeds of the opposed mounting heads in each cycle.

FIG. 10 is a plan view of another mounting head of the electronic component mounting device.

DETAILED DESCRIPTION

Modes for Carrying Out the Disclosure

Figure 1:
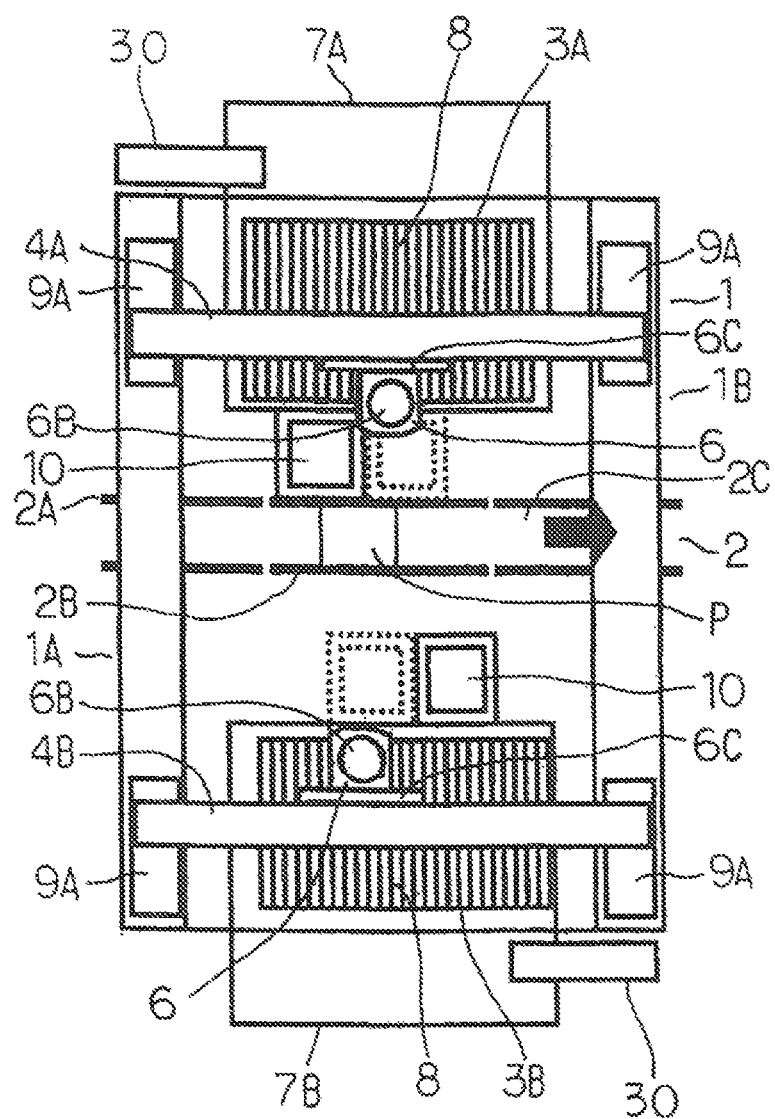
FIG. 1 is a plan view of an electronic component mounting device.

An embodiment of the present disclosure is hereinafter described on the basis of the drawings.

The structure of an electronic component mounting device 1 that mounts electronic components C on a printed board P is now described with reference to FIGS. 1 to 10. The electronic component mounting device 1 is provided with a conveyor 2 that conveys each printed board P and component feeders 3A and 3B that are proximally and distally arranged in a device body and feed the electronic components C. The electronic component mounting device 1 is provided with a pair of beams 4A and 4B movable in one direction (reciprocally movable in a direction Y) by a drive source and mounting head bodies 6. The mounting head bodies 6 are configured to be movable in a direction along each of the beams 4A and 4B. Two mounting head bodies 6 (mounting heads 6B) are provided. More specifically, the mounting head (second mounting head) 6B distally located and the mounting head (first mounting head) 6B proximally located, are movable independently of the mounting head 6B distally located. The mounting head bodies 6 (mounting heads 6B) are described in detail later on the basis of FIG. 2. The electronic component mounting device 1 is an example of the "component mounting device" in the present disclosure. The printed board P is an example of the "substrate" in the present disclosure. The electronic components C are examples of the "component" in the present disclosure.

The conveyor 2 includes a feed conveyor 2A, a positioning portion 2B that positions and fixes the printed board P, and a discharge conveyor 2C. The feed conveyor 2A conveys the printed board P conveyed from the upstream to the positioning portion 2B. In the positioning portion 2B, the electronic components C are mounted on each printed board P positioned by a positioning device (not shown). Then, the printed board P mounted with the electronic components C is conveyed to the discharge conveyor 2C. The discharge conveyor 2C is configured to convey the printed board P to a downstream device.

The component feeders 3A and 3B are distally and proximally arranged in the conveyor 2, respectively. The component feeders 3A and 3B are ones in which many component feed units 8 are aligned on feeder bases of cart bases 7A and 7B, which are mounts, respectively. Each of the cart bases 7A and 7B is arranged in the device body such that the tips of the component feed units 8 closer to a component feeding side head to a conveyance path of the printed board P. Each of the cart bases 7A and 7B is detachably arranged in the device body through a connector (not shown). When each of the cart bases 7A and 7B is properly mounted on the device body, the component feed units 8 mounted on each of the cart bases 7A and 7B are powered. Each of the cart bases 7A and 7B is configured to be movable by casters provided on the lower surface when the connector is released and a handle is pulled.

The pair of beams 4A and 4B are configured to extend in a direction X. The beams 4A and 4B move in a direction Y by driving of Y-direction movement drive sources. The Y-direction movement drive sources include a linear motor. A slider fixed to each of the beams slides along a pair of right and left guides extending back and forth so that the beams 4A and 4B move individually in the direction Y. The Y-direction movement drive sources include pairs of upper and lower stators fixed along a pair of right and left bases 1A and 1B and movable bodies 9A fixed to lower positions of mounting plates provided on both ends of the beams 4A and 4B.

The mounting head bodies 6 are provided inside the beams 4A and 4B, respectively. The mounting head bodies 6 move along guides in the longitudinal direction (direction X) of the beams 4A and 4B by X-direction movement drive sources. The X-direction movement drive sources include a linear motor. The X-direction movement drive sources include a pair of front and back stators fixed to each of the beams 4A and 4B and a movable body located between each pair of stators, provided on the mounting head bodies 6.

Each of the mounting head bodies 6 is provided inside each of the beams 4A and 4B to face each other. The mounting head body 6 distally located is configured to be capable of taking out the electronic components C from the component feed unit 8 of the component feeder 3A distally located and of mounting the electronic components C on the printed board P placed on the conveyor 2. The mounting head body 6 proximally located is configured to be capable of taking out the electronic components C from the component feeder 3B proximally located and of mounting the electronic components C on the printed board P.

Figure 2:
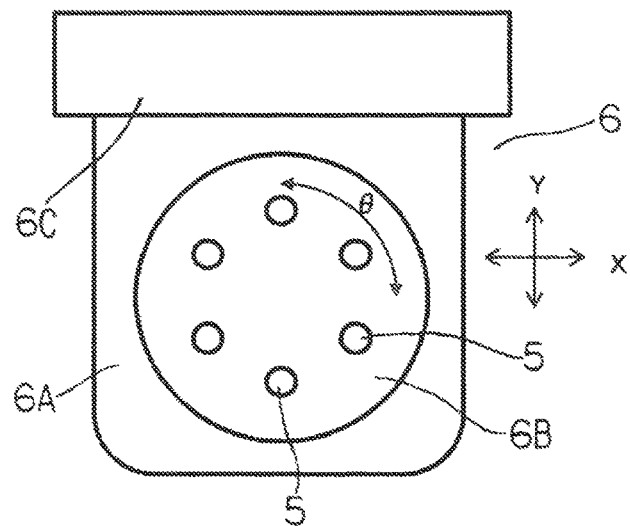
FIG. 2 is a plan view of a mounting head of the electronic component mounting device.

As shown in FIG. 2, each of the mounting head bodies 6 includes a head mounting body 6A and the mounting head 6B having a substantially circular shape in a plan view. The mounting head bodies 6 (mounting heads 6B) are configured to be movable in a horizontal direction and to mount the held electronic components C on the printed board P. The mounting heads 6B are formed in a substantially columnar shape. The mounting head bodies 6 are movably mounted on the beams 4A and 4B through mounting members 6c, respectively. A plurality of suction nozzles 5 as component holders are arranged at predetermined intervals on concentric circles in peripheral edges of the mounting heads 6B.

Figure 3:
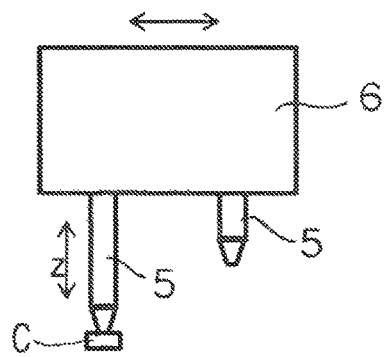
FIG. 3 is a side elevational view of the mounting head of the electronic component mounting device.
Figure 4:
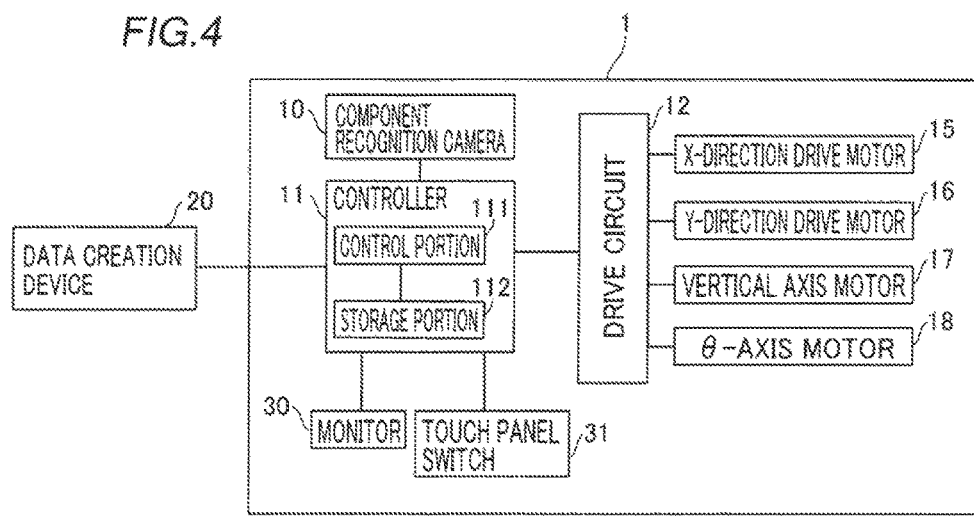
FIG. 4 is a control block diagram of a drive system of the electronic component mounting device.

As shown in FIG. 3, the plurality of suction nozzles 5 are movable individually in a vertical direction (arrow direction Z) with respect to the mounting head bodies 6 by vertical axis motors 17 (see FIG. 4). The suction nozzles 5 are configured to be selected by unshown selection mechanisms, and the selected suction nozzles 5 can individually protrude from the mounting head bodies 6. The mounting head bodies 6 rotate about vertical axes (in a direction θ, which is in an arrow direction in FIG. 2), by driving of θ-axis motors 18 (see FIG. 4) so that the suction nozzles 5 are rotatable about vertical axes passing through the centers of the mounting head bodies 6. The suction nozzles 5 move in the vertical direction and rotate in the direction θ to take out the electronic components C from the component feed units 8.

Then, the mounting head bodies 6 move in the directions X and Y so that the electronic components C are mounted on the printed board P.

As shown in FIG. 1, the component feed units 8 include unshown tape feed mechanisms and cover tape peeling mechanisms. The tape feed mechanisms include rotatable feed sprockets. Storage tapes are wound on feed reels rotatably mounted on the cart bases 7A and 7B. The storage tapes include feed holes provided at a predetermined interval, engaging with teeth of the feed sprockets. The storage tapes are configured to be sequentially sent out. The feed sprockets are rotated at predetermined angles by feed motors so that the storage tapes are intermittently sent out to component suction taking-out positions for the electronic components C. The cover tape peeling mechanisms are configured to peel cover tapes from carrier tapes by driving of peeling motors before reaching the suction taking-out positions. The cover tape peeling mechanisms peel the cover tapes so that the electronic components C loaded onto storages of the carrier tapes are sequentially fed to the component suction taking-out positions.

Each of component recognition cameras 10 is configured to image, in block, the electronic components C suctioned and held by the suction nozzles 5 of each of the mounting heads 6B. The component recognition cameras 10 are configured to image the electronic components C from below before the electronic components C are mounted on the printed board P.

Monitors 30 are monitors including touch panel switches 31. An operator pushes the various touch panel switches 31 of the monitors 30 to start or stop operating the electronic component mounting device 1.

A control block of the electronic component mounting device 1 is now described on the basis of FIG. 4. A controller controls the overall operation of the electronic component mounting device 1. Specifically, the controller 11 performs control such as drive-related control of the mounting head bodies 6. First, the mounting head bodies 6 are movable in the directions X and Y by X-direction drive motors 15 (X-direction movement drive sources) and Y-direction drive motors 16 (Y-direction movement drive sources). The X-direction drive motors 15 and the Y-direction drive motors 16 are drivingly controlled through a drive circuit 12 by the controller 11. The component recognition cameras 10 are connected to the controller 11. The controller 11 performs recognition processing on captured images. The controller 11 is connected with the monitors 30 and the touch panel switches 31. The controller 11 includes a control portion 111 including a CPU and a storage portion 112. The controller 11 (control portion 111) is configured to control the operation of the mounting heads 6B.

Figures 5, 6, 7:
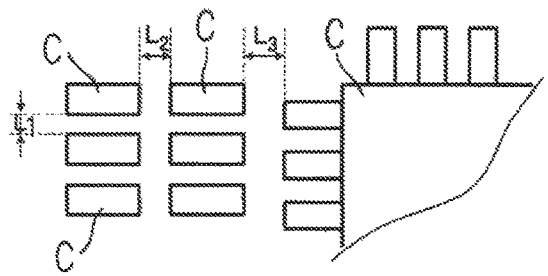
FIG. 5 is a diagram showing mounting data.
FIG. 6 is a diagram showing original mounting data.
FIG. 7 is a plan view showing a state in which electronic components are mounted on a printed board.

The storage portion 112 of the controller 11 stores mounting data (see FIG. 5). The mounting data are data containing orders in which the suction nozzles 5 mount the electronic components C on the printed board P and mounting positions. The controller 11 mounts the electronic components C on the printed board P according to the mounting data.

The controller 11 is connectable with a data creation device 20. The data creation device 20 is configured to create the mounting data (see FIG. 5). The mounting data are created for each type of printed board P. The data creation device 20 is configured to transfer the mounting data to the controller 11 of the electronic component mounting device 1. First, original mounting data (see FIG. 6) containing the type of electronic component (indicated as COMPONENT ID) to be mounted on the printed board P for which the mounting data are created, with a position on the printed board P to be mounted with the component, and a mounting angle input into the data creation device 20. The data creation device 20 optimizes the original mounting data and creates the mounting data (see FIG. 5) such that the electronic component mounting device 1 can efficiently mount the electronic components C. Specifically, the data creation device 20 optimizes mounting orders for the components and mounting positions (FEEDER NO.) on the cart bases 7A and 7B for the component feed units 8 that feed the electronic components C and creates the mounting data on the basis of the original mounting data.

FIG. 7 is a plan view showing the arrangement of the components mounted on the printed board P according to the original mounting data such as the data in FIG. 6. Intervals between the adjacent electronic components C may be relatively wide (L1 to L3, for example), but the intervals between the adjacent electronic components C may be considerably narrow. If a "0603" component (a chip electronic component having a dimension of 0.3 mm wide by 0.6 mm long) and a "0402" component (a chip electronic component having a dimension of 0.2 mm wide by 0.4 mm long) are mounted side by side, for example, the adjacent electronic components C may be mounted at intervals of 0.2 mm or less. Furthermore, the electronic components C may be mounted closely adjacent to each other such that intervals between the adjacent electronic components C are almost 0.1 mm.

The terms "closely adjacent" include a concept indicating that the components are arranged adjacent to each other at the narrow intervals of a predetermined threshold or less.

When the electronic components C are mounted closely adjacent to each other on the printed board P, the electronic components C may not be able to be mounted on predetermined positions even if the suction nozzles 5 suction the electronic components C while slightly deviating from the centers of the electronic components C. This is because when the speed of mounting the electronic components C is high, the adjacent electronic components C and the suction nozzles 5 interfere with each other due to vibrations or the like so that the electronic components C may not be able to be mounted on the predetermined positions. The speed of mounting the electronic components C includes the movement speed of the mounting head bodies 6 in the directions X and Y, the downward movement speed of the suction nozzles 5, the rotation speed of the mounting heads 6B, etc.

In order to prevent the electronic components C and the suction nozzles 5 from interfering with each other by controlling this speed of mounting the electronic components C even when the electronic components C are to be located closely adjacent to each other, a flag indicating that an electronic component C is to be located closely adjacent to another electronic component C is stored in the mounting data (see FIG. 5) when the adjacent intervals are not more than a threshold, setting a predetermined adjacent interval as the threshold. The close adjacency flag is not contained in the original mounting data (see FIG. 6). When the data creation device (see FIG. 4) creates data optimized as shown in FIG. 5 on the basis of the original mounting data, the intervals between the electronic components C adjacent to each other when all the electronic components C are mounted on the printed board P are calculated. Then, a value "1" representing the close adjacency flag is stored in a step number (see FIG. 5) of the electronic component C to be mounted adjacent to another electronic component C at the adjacent interval of the threshold or less. Processing for storing the close adjacency flag may be performed by the electronic component mounting device 1 so far as the controller 11 of the electronic component mounting device 1 has a function of optimizing the original mounting data and creating the mounting data. Furthermore, the original mounting data may be created to have, in advance, information about the close adjacency flag. In this case, processing for optimizing the original mounting data and creating the mounting data associated with the close adjacency flag can be omitted.

The threshold may be a fixed value (0.15 mm, for example) or a variable value. The threshold also may be varied according to the type of electronic components C. Furthermore, the threshold may be varied according to the direction of the electronic components C (different thresholds along the short-side direction and the long-side direction of a rectangular component may be set, for example).

The created mounting data (see FIG. 5) are stored in the storage portion 112 of the controller 11. The electronic components C are mounted on the basis of information about the mounting positions and the mounting angles for the electronic components C in the mounting data. According to this embodiment, the controller 11 (control portion 111) is configured to perform control of making the speed of mounting, by the mounting heads 6B, the electronic components C to be located closely adjacent to other electronic components and to be mounted on the printed board P such that the intervals to the adjacent electronic components C are equal to or less than the predetermined threshold, on the printed board P, less than the speed of mounting in a normal state in which the mounting heads 6B mount the electronic components C, which are not the electronic components C to be located closely adjacent to other electronic components, on the printed board P. This control is hereinafter described in detail.

The operation according to the mounting data containing the arrangement of the electronic components to be located closely adjacent to other electronic components is now described. The controller 11 stores a program in a flowchart (see FIG. 8) for controlling the movement speed of the mounting head bodies 6. The controller 11 also controls the up-and-down movement of the suction nozzles 5 and the rotation of the mounting heads 6B on the basis of the close adjacency flag in the mounting data. The following processing is performed by the control portion 111 of the controller 11.

First, the printed board P is conveyed from an upstream device to the positioning portion 2B by the feed conveyor 2A and is positioned by the positioning portion 2B.

Then, an electronic component C is suctioned from a component feed unit 8 (see FIG. 1) at the position of a specified feeder No. for each step of the mounting data shown in FIG. 5. Assuming that the mounting head 6B proximally (on the lower side) located in FIG. 1 is a head 1, an electronic component C in a step 1 of a cycle number 1a is suctioned. A predetermined suction nozzle 5 of the mounting head 6B is rotated in the direction θ about the vertical axis of the mounting head 6B, and is moved in the horizontal direction (directions X and Y) by driving of the X-direction drive motors 15 and the Y-direction drive motors 16. Then, the predetermined suction nozzle 5 is stopped above the position of the component feed unit 8 specified by the mounting data, at which the electronic component C is taken out.

Then, the suction nozzle 5 goes down and suctions the electronic component C fed by the component feed unit 8. Then, the suction nozzle 5 goes up. The mounting head 6B is rotated such that a subsequent suction nozzle 5 of the mounting head (first mounting head) 6B labeled as a head number 1 suctions an electronic component C in the next step, and the mounting head body 6 is moved in the directions X and Y. Thus, the subsequent suction nozzle 5 is moved above the position of the component feed unit 8, at which the component is taken out, in which the electronic component C to be suctioned in the next step is arranged. Similarly to the above, the suction nozzle 5 moves in the direction Z (vertical direction) and takes out the electronic component C. In this manner, all the suction nozzles specified by the mounting data suction the electronic components in the mounting head (first mounting head) 6B labeled as the head number 1. The component mounting operation in one cycle (cycle 1a) of the mounting data is terminated by the above operation.

Then, in a state in which all the electronic components C are held by the respective suction nozzles 5, the mounting head body 6 moves above the component recognition camera 10. Then, the electronic components C suctioned and held by the respective suction nozzles 5 are imaged from below by the component recognition camera 10. Thus, an image of the electronic components C held by the respective suction nozzles 5 is acquired. All the electronic components C held by the mounting head 6B are imaged in block in the same screen. On the basis of this image, the amount of misalignment of each of the electronic components C is recognized by the controller 11.

Then, the mounting head body 6 is moved so that the suction nozzle 5 that suctions the electronic component C in the first step is positioned at the mounting position (X-Y coordinates) and the mounting angle (angle θ) shown by the mounting data. The alignment at the mounting angle θ is made by the rotation of the mounting head 6B. On the basis of the aforementioned component recognition result, the misalignment of the electronic component C with respect to the suction nozzle 5 is corrected, and the suction nozzle 5 is properly stopped at the position in the mounting data.

Then, the suction nozzle 5 that suctions the electronic component C does down. After the electronic component C is mounted on the printed board P, the suction nozzle 5 goes up.

Then, the electronic component C in the next step in the same cycle (cycle 1a) of the mounting data is positioned at the next mounting position. Then, the suction nozzle 5 goes down and up so that the electronic component C in the next step is mounted on the printed board P.

In this manner, the electronic components C (all the electronic components C held by the mounting head 6B) in the cycle 1a are mounted on the printed board P.

Concurrently with the suction and mounting in the cycle 1a, the mounting head 6B on the upper side (the mounting head 6B distally located; see FIG. 1) starts suctioning the electronic component C in a cycle 1b of the mounting data from the component feed unit 8 mounted on the component feeder 3A on the upper side. Then, the component recognition camera 10 on the upper side performs imaging and recognition processing. Then, the electronic components C in the cycle 1b are mounted on the printed board P. In each cycle, the suction nozzle 5 may start going down at the timing before the mounting head body 6 stops moving.

In this manner, the electronic components C are suctioned and mounted according to the mounting data shown in FIG. 5. When the mounting head (first mounting head) 6B labeled as the head number 1 finishes suctioning the electronic components C in a cycle 3a, the mounting head body 6 moves above the component recognition camera 10. Then, the component mounting operation in a step 21 is performed.

At this time, the controller 11 drivingly controls the movement of the mounting head bodies 6, and determines the movement speeds of the mounting head bodies 6. The movement speeds of the mounting head bodies 6 are determined on the basis of a flowchart shown in FIG. 8.

In order to determine the movement speeds of the mounting head bodies 6, the controller 11 has data (component current holding table; not shown) indicating that the electronic component C has been held by each suction nozzle of each head number when the electronic component C has been held. The controller 11 performs operations of suctioning the electronic components C according to the steps of the mounting data shown in FIG. 5. When suctioning the electronic component C, the controller 11 performs control of turning on a hold flag for the suction nozzle that has suctioned the electronic component C in the component current holding table. The controller 11 performs control of turning off the hold flag when the held electronic component C is mounted on the printed board P. Information about whether or not the held electronic component C is a component to be located closely adjacent to another component (a component having a narrow interval to an adjacent electronic component C), which has 1 as the close adjacency flag (see FIG. 5) in the mounting data, is also stored in the component current holding table in a state in which the held electronic component C is associated with the number of the suction nozzle.

The movement speeds of the mounting head bodies 6 for mounting the electronic components C are now described.

First, the controller 11 determines whether or not the electronic component C held by the mounting head (first mounting head) 6B labelled as the head number 1 is the component to be located closely adjacent to another component (ST1 in the flowchart; see FIG. 8). At this time, the mounting head 6B suctions and holds all the electronic components C in the cycle 3*a* (steps 21 to 26; see FIG. 5). The controller 11 can determine whether or not the mounting head 6B holds the electronic component C of the close adjacency flag of "1" from the aforementioned component current holding table (not shown). In the cycle 3*a* in FIG. 5, the mounting head (first mounting head) 6B labelled as the head number 1 does not hold the component to be located closely adjacent to another component, and hence the controller 11 determines "No" at the ST1.

Then, the controller 11 advances to a ST2 in the flowchart, and determines whether or not the electronic component C held by the mounting head (the second mounting head opposed to the mounting head 6B labelled as the head number 1) 6B labelled as a head number 2 is the component of the close adjacency flag of "1" in the component current holding table. In this case, when there is no electronic component C of the close adjacency flag of "1" in the cycle 2*b* when the mounting head (the second mounting head) 6B labelled as the head number 2 performs a suctioning or mounting operation in the cycle 2*b*, the controller 11 determines "No" at the ST2.

Then, the controller 11 advances to a ST3 in the flowchart, and determines whether or not there is a step in which the close adjacency flag of the mounting data in FIG. 5 is "1" in the next cycle 3*b* of the opposed head (the mounting head 6B labelled as the head number 2). In an example shown in FIG. 5, there is the close adjacency flag of "1" in a step 29 in the cycle 3*b*, and hence the controller 11 determines "Yes" at the ST3. In the step 21, the movement speed of the mounting head body 6 for mounting the electronic components C is made less than normal.

More specifically, when at least one of the mounting head 6B proximally located (the first mounting head) and the mounting head 6B distally located (the second mounting head) holds the electronic component C to be located closely adjacent to another electronic component, the controller 11 (control portion 111) is configured to perform control of making the horizontal movement speeds of both the mounting head 6B proximally located and the mounting head 6B distally located less than the movement speeds in the normal state in which both the mounting head 6B proximally located and the mounting head 6B distally located hold only the electronic components C that are not the electronic components C to be located closely adjacent to other electronic components.

In order to restrain even slight suction misalignment caused by the vibrations when the mounting head bodies 6 having a heavy weight move at a high speed from easily causing the interference of the suction nozzles 5 with the adjacent electronic components C, the movement speeds in the directions X and Y of the mounting head bodies 6 holding the electronic components C are reduced. When the opposed mounting head 6B moves over the printed board P to mount the component or approaches the printed board P to mount the component, the suction nozzle 5 may be influenced by the vibrations, and hence it is good to reduce the movement speed of the opposed mounting head body 6. At this time, during the mounting operation of the mounting head 6B, the opposed mounting head body 6 may finish mounting the components in the current cycle and start mounting the components in the next cycle (which is a cycle next to the cycle of the mounting head 6B; if the current cycle of the mounting head 6B is 3*b*, the cycle is 4*a*). Therefore, as to the opposed mounting head 6B, the controller 11 makes a determination up to the next cycle, and reduces the movement speeds of the mounting head bodies 6 in the directions X and Y when there is the electronic component C of the close adjacency flag. Thus, the controller 11 controls the operation of the mounting head bodies 6 (mounting heads 6B) such that the electronic components C are accurately mounted.

The horizontal movement speed of the mounting head body 6 may be reduced in order for the opposed mounting head body 6 to mount the electronic component C to be located closely adjacent to another electronic component C not only when the mounting head body 6 mounts the electronic components C on the printed board P but also when the mounting head body 6 moves to suction the components. Furthermore, conditions causing speed reduction may be varied by setting.

The speed is preferably reduced by reducing an absolute value of an acceleration rate or a deceleration rate (a minus acceleration rate for reducing the speed from the maximum speed). The mounting head bodies 6 are configured to travel the same distance, but are conceivably set such that the speed is reduced from a normal speed by a predetermined percentage (%). The normal speed may be a speed at which the mounting head bodies 6 move the fastest (the maximum speed fixed regardless of the type of electronic components C) when moving while holding the electronic components C, or a speed set in component data for each type of electronic component C.

The operation of mounting the electronic components C based on the mounting data shown in FIG. 5 overlaps in the previous and next cycles (the cycles of the mounting heads 6B opposed to each other), but the controller 11 controls the mounting heads 6B such that the mounting operation of the opposed mounting head 6B in the next cycle is not started before the cycle of the mounting head 6B is finished. More specifically, in the example shown in FIG. 5, the controller 11 controls the mounting heads 6B such that the operation of mounting the electronic components C in a cycle 4b is not started before mounting of all the electronic components C in the cycle 3a is finished.

When mounting of the electronic components C in the step 21 (mounting data; see FIG. 5) is performed, the mounting head body 6 moves to the mounting position at the reduced movement speed. More specifically, the controller 11 (control portion 111) performs control of making the horizontal movement speed of the mounting head 6B less than the horizontal movement speed in the normal state in which the mounting head 6B mounts the electronic component C, which is not the electronic component C to be located closely adjacent to another electronic component C, on the printed board P, when the mounting head 6B mounts the electronic component C to be located closely adjacent to another electronic component C on the printed board P. The downward movement speed of the suction nozzle 5 is not reduced since the close adjacency flag of the electronic components C that this suction nozzle 5 mounts is not "1", but the suction nozzle 5 goes up and down at the normal speed.

In this manner, the mounting operation (see upper two columns of the head 1 in FIG. 9) in the cycle 3a up to a step 26 (mounting data; see FIG. 5) is performed at the reduced speed. However, as described above, only the movement speed of the mounting head body 6 is reduced, and the downward movement speed of the suction nozzle 5 and the rotation speed of the mounting head 6B are not reduced. The downward movement speed of the suction nozzle 5 and the rotation speed of the mounting head 6B may also be reduced so that generation of the vibrations is further restrained.

Then, as to the mounting operation in a step 27 (mounting data; see FIG. 5), a speed reduction is determined by the determination at the ST1 in FIG. 8, and the movement speed of the mounting head body 6 in the cycle 3b is reduced. The mounting operation in the cycle 3b also includes the rotational movement of the mounting head 6B in the direction θ, but the rotation speed of the mounting head 6B in the direction θ is not reduced since an influence of this rotation is conceivably small when the electronic components C are not the electronic components C of the close adjacency flag (in a step 27, for example). However, also in this case, the controller 11 may control the mounting head 6B to reduce the rotation speed in the direction θ.

Then, when the electronic components C in a step 29 (mounting data; see FIG. 5) are mounted, the speed is reduced during the mounting operation including not only the movement of the mounting head body 6 but also the rotation of the mounting head 6B and the downward movement of the suction nozzle 5, as shown in a column of close adjacency in FIG. 9. More specifically, the controller 11 (control portion 111) performs control of making the vertical movement speed of the suction nozzle 55 less than the movement speed in the normal state when the electronic component C to be located closely adjacent to another electronic component C is mounted on the printed board P. Even more specifically, the controller 11 (control portion 111) performs control of making the vertical movement speed of the suction nozzle 5 suctioning the electronic component C to be located closely adjacent to another electronic component C less than the movement speed in the normal state when the electronic component C to be located closely adjacent to another electronic component C is mounted on the printed board P when at least one of the plurality of suction nozzles 5 suctions the electronic component C to be located closely adjacent to another electronic component C. Furthermore, the controller 11 (control portion 111) performs control of making the rotation speed about the axis less than the rotation speed in the normal state in addition to control of making the vertical movement speed of the suction nozzle 5 less than the movement speed in the normal state when the electronic component C to be located closely adjacent to another electronic component C is mounted on the printed board P. The controller 11 (control portion 111) may perform control of reducing the downward movement speed of the suction nozzle 5.

Then, as to the mounting operation in a step 30 (mounting data; see FIG. 5), the mounting head 6B does not reduce its own speed since it can be seen from the component current holding table that the mounting head 6B does not hold the electronic component C to be located closely adjacent to another electronic component C. Thus, not only the rotation of the mounting head 6B and the downward movement of the suction nozzle 5 but also the movement of the mounting head body 6 is performed at the normal speed (a column located immediately below the column of close adjacency of the head 2 in FIG. 9). While the mounting head (second mounting head) 6B labelled as the head number 2 holds the electronic component C to be located closely adjacent to another electronic component C in the mounting operation, the movement speed of the opposed mounting head body 6 (mounting head 6B) labelled as the head number 1 is also reduced on the basis of the data in the component current holding table. However, after the mounting in the step 29 is finished, a speed reduction during the mounting operation of the mounting head 6B is stopped, as shown in FIG. 9. More specifically, the controller 11 (control portion 111) performs control of releasing the state in which the speed of the mounting operation performed by the suction nozzles 5 is reduced on the basis of the completion of the mounting of the electronic component C to be located closely adjacent to another electronic component C in the state in which the plurality of suction nozzles 5 suction the electronic component C to be located closely adjacent to another electronic component C and the electronic component C, which is not the electronic component C to be closely adjacent to another electronic component C, in a mixed manner.

Not only when the mounting heads 6B are rotary (see FIG. 2) but also when a plurality of suction nozzles 50 (see FIG. 10) are aligned in a row, as shown in FIG. 10 (a plan view), the movement speed of mounting heads 60 (see FIG. 10) in directions X and Y and the downward movement speed of the suction nozzles 50 are controllable similarly to the above.

In the above case, the deceleration rate is flat, but the deceleration rate may be varied according to a component or the amount of misalignment between the suction nozzle 5 and the electronic component C at the time of recognition of the component recognition camera 10. If the amount of misalignment between the suction nozzle 5 and the electronic component C is large, for example, the speed is conceivably further reduced in order for the mounting head body 6 to move at a low speed. If the amount of misalignment is too large, the electronic component C is preferably not mounted on the printed board P but discarded. Furthermore, as to the electronic component C, the close adjacency flag of which is 1 in the mounting data in FIG. 5, the movement speed of the mounting head body 6, the downward/upward movement speed of the suction nozzle 5, or the rotation speed of the mounting head 6B may be reduced before and after the electronic component C, the close adjacency flag of which is 1, is suctioned from the component feed unit 8. In addition, the speed at which the component feed unit 8 feeds the electronic components C may be reduced so that positioning at an accurate feed location is performed.

Although the embodiment of the present disclosure has been described above, various alternatives, modifications, or variations are possible for any person skilled in the art based on the above description. The present disclosure includes various alternatives, modifications, or variations described above without departing from the scope of the present disclosure.

The invention claimed is:

1. A component mounting device comprising:
a mounting head that is movable in a horizontal direction and mounts a held component on a substrate; and
a control portion that controls operation of the mounting head,
the control portion being configured to perform control of making a speed of mounting, by the mounting head, of a component to be located closely adjacent to another component and to be mounted on the substrate such that an interval to an adjacent component is equal to or less than a predetermined threshold, on the substrate, less than a speed of mounting in a normal state in which the mounting head mounts a component, which is not the component to be located closely adjacent to another component, on the substrate,
wherein
the mounting head includes a plurality of suction nozzles movable in a vertical direction, and
the control portion is configured to perform control of releasing a state in which a speed of mounting operation performed by the suction nozzles is reduced, on the basis of completion of mounting of the component to be located closely adjacent to another component, in a state in which the plurality of suction nozzles suction the component to be located closely adjacent to another component and the component, which is not the component to be located closely adjacent to another component, in a mixed manner.

2. The component mounting device according to claim 1, wherein
the control portion is configured to perform control of making a horizontal movement speed of the mounting head where the mounting head mounts the component to be located closely adjacent to another component on the substrate less than the horizontal movement speed in the normal state in which the mounting head mounts the component, which is not the component to be located closely adjacent to another component, on the substrate.

3. The component mounting device according to claim 1, wherein
the control portion is configured to perform control of making a vertical movement speed of the suction nozzles less than the movement speed in the normal state when the component to be located closely adjacent to another component is mounted on the substrate.

4. The component mounting device according to claim 3, wherein
the mounting head is configured to be rotatable about an axis extending in the vertical direction, and
the control portion is configured to perform control of making a rotation speed about the axis less than the rotation speed in the normal state, in addition to the control of making the vertical movement speed of the suction nozzles less than the movement speed in the normal state, when the component to be located closely adjacent to another component is mounted on the substrate.

5. The component mounting device according to claim 3, wherein
the control portion is configured to perform control of making the vertical movement speed of the suction nozzle that suctions the component to be located closely adjacent to another component less than the movement speed in the normal state when the component to be located closely adjacent to another component is mounted on the substrate when at least one of the plurality of suction nozzles suctions the component to be located closely adjacent to another component.

6. A component mounting device comprising:
a mounting head that is movable in a horizontal direction and mounts a held component on a substrate; and
a control portion that controls operation of the mounting head,
the control portion being configured to perform control of making a speed of mounting, by the mounting head, of a component to be located closely adjacent to another component and to be mounted on the substrate such that an interval to an adjacent component is equal to or less than a predetermined threshold, on the substrate, less than a speed of mounting in a normal state in which the mounting head mounts a component, which is not the component to be located closely adjacent to another component, on the substrate,
wherein
the control portion is configured to perform control of making a horizontal movement speed of the mounting head where the mounting head mounts the component to be located closely adjacent to another component on the substrate less than the horizontal movement speed in the normal state in which the mounting head mounts the component, which is not the component to be located closely adjacent to another component, on the substrate,
the mounting head includes a first mounting head and a second mounting head movable independently of the first mounting head, and
the control portion is configured to perform control of making horizontal movement speeds of both the first mounting head and the second mounting head less than the movement speeds in a normal state in which both the first mounting head and the second mounting head hold only the component, which is not the component to be located closely adjacent to another component, when at least one of the first mounting head and the second mounting head holds the component to be located closely adjacent to another component.

7. A component mounting device comprising:
a mounting head that is movable in a horizontal direction and mounts a held component on a substrate; and
a control portion that controls operation of the mounting head,
the control portion being configured to perform control of making a speed of mounting, by the mounting head, of a component to be located closely adjacent to another component and to be mounted on the substrate such that an interval to an adjacent component is equal to or less than a predetermined threshold, on the substrate, less than a speed of mounting in a normal state in which the mounting head mounts a component, which is not the component to be located closely adjacent to another component, on the substrate, wherein the control portion is configured to perform control of making the speed of mounting, by the mounting head, of the component to be located closely adjacent to another component on the substrate less than the speed of mounting in the normal state in which the mounting head mounts the component, which is not the component to be located closely adjacent to another component, on the substrate, on the basis of information about a mounting position and a mounting angle of the component.

8. A component mounting method comprising:

holding, by a mounting head, a component to be mounted on a substrate;

making a speed of mounting, by the mounting head, of a component to be located closely adjacent to another component, of which an interval to an adjacent component is equal to or less than a predetermined threshold, on the substrate, less than a speed of mounting, by the mounting head, of a component, of which an interval to an adjacent component is not equal to or less than the predetermined threshold; and releasing a state in which a speed of mounting operation performed by a plurality of suction nozzles of the mounting head is reduced, on the basis of completion of mounting of the component to be located closely adjacent to another component, in a state in which the plurality of suction nozzles suction the component to be located closely adjacent to another component and the component, which is not the component to be located closely adjacent to another component, in a mixed manner.

* * * * *